(12) United States Patent
Kanazawa et al.

(10) Patent No.: US 7,068,983 B2
(45) Date of Patent: Jun. 27, 2006

(54) METHOD FOR DETECTING QUADRATURE MODULATOR CARRIER LEAK ADJUSTING POINT BY GEOMETRICAL ANALYSIS/CALCULATION METHOD, CARRIER LEAK ADJUSTING METHOD, AND QUADRATURE MODULATION APPARATUS

(75) Inventors: Norio Kanazawa, Ebina (JP); Masahiro Tsuchiya, Atsugi (JP)

(73) Assignee: Anritsu Corporation, Atsugi (JP)

( * ) Notice: Subject to any disclaimer, the term of this patent is extended or adjusted under 35 U.S.C. 154(b) by 384 days.

(21) Appl. No.: 10/474,391

(22) PCT Filed: Feb. 19, 2003

(86) PCT No.: PCT/JP03/01806

§ 371 (c)(1),
(2), (4) Date: Oct. 9, 2003

(87) PCT Pub. No.: WO03/071755

PCT Pub. Date: Aug. 28, 2003

(65) Prior Publication Data

US 2004/0162038 A1  Aug. 19, 2004

(51) Int. Cl.
H04B 1/04 (2006.01)
H04K 1/02 (2006.01)
(52) U.S. Cl. .................. 455/123; 455/114.1; 455/102; 375/296
(58) Field of Classification Search ............. 455/106, 455/114.1, 114.3, 120, 126, 127.1, 127.5, 455/115.1, 115.4, 102, 104, 123; 375/296, 375/297
See application file for complete search history.

(56) References Cited

U.S. PATENT DOCUMENTS

| 4,717,894 | A | | 1/1988 | Edwards et al. |
| 5,396,196 | A | * | 3/1995 | Blodgett ................. 455/114.2 |
| 5,793,817 | A | * | 8/1998 | Wilson ................... 455/115.1 |
| 5,847,619 | A | * | 12/1998 | Kirisawa ................... 375/296 |
| 5,903,823 | A | * | 5/1999 | Moriyama et al. .......... 455/126 |
| 6,081,698 | A | * | 6/2000 | Moriyama et al. .......... 375/297 |
| 6,298,096 | B1 | * | 10/2001 | Burgin ..................... 375/296 |
| 6,421,397 | B1 | | 7/2002 | McVey |
| 6,421,398 | B1 | | 7/2002 | McVey |
| 6,819,910 | B1 | * | 11/2004 | Shi et al. ................... 455/102 |
| 2002/0018531 | A1 | * | 2/2002 | Ratto ....................... 375/297 |
| 2002/0191713 | A1 | | 12/2002 | McVey |
| 2003/0040290 | A1 | * | 2/2003 | Sahlman et al. ......... 455/115.2 |

FOREIGN PATENT DOCUMENTS

EP  0 265 218 A2  4/1988

(Continued)

Primary Examiner—Lana Le
(74) Attorney, Agent, or Firm—Frishauf, Holtz, Goodman & Chick, P.C.

(57) ABSTRACT

The first, second, and third pairs of DC voltages which set a modulated signal to a predetermined reference level while the levels of I and Q signals supplied to a quadrature modulator are set at "0" are sequentially obtained. On the basis of the first, second, and third pairs of DC voltages, at least three measurement points based on a combination of pairs of DC voltages which set the level of the modulated signal to the predetermined reference level are decided. The coordinates of the center of a virtual circle having the three measurement points positioned on its circumference are automatically calculated by a geometric analytical computation. Adjustment voltages to be added to the I and Q signals so as to cancel out a carrier leak contained in the modulated signal are obtained from the coordinates of the center.

16 Claims, 5 Drawing Sheets

FOREIGN PATENT DOCUMENTS

| | | |
|---|---|---|
| EP | 0 661 801 A1 | 7/1995 |
| EP | 1 120 944 A2 | 8/2001 |
| JP | 63-119339 A | 5/1988 |
| JP | 4-248732 A | 9/1992 |
| JP | 7-58791 A | 3/1995 |
| JP | 8-18612 A | 1/1996 |
| JP | 9-162939 A | 6/1997 |
| JP | 10-65570 A | 3/1998 |
| JP | 2000-244596 A | 9/2000 |
| JP | 2001-7869 A | 1/2001 |

* cited by examiner under 35 USC 371 of International Application PCT/JP03/01806 filed Feb. 19, 2003.

METHOD FOR DETECTING QUADRATURE MODULATOR CARRIER LEAK ADJUSTING POINT BY GEOMETRICAL ANALYSIS/CALCULATION METHOD, CARRIER LEAK ADJUSTING METHOD, AND QUADRATURE MODULATION APPARATUS

This application is a U.S. National Phase Application under 35 USC 371 of International Application PCT/JP03/01806 filed Feb. 19, 2003.

TECHNICAL FIELD

The present invention relates to a carrier leak adjustment detection method for a quadrature modulator which detects a adjustment voltage for canceling out a carrier leak contained in a modulated signal output from a quadrature modulator, a carrier leak adjustment method for the quadrature modulator for canceling out a carrier leak, and a quadrature modulation apparatus having a function of adjusting this carrier leak.

BACKGROUND ART

In general, in a data transmission system, as shown in FIG. 5A, a multiplier multiplies a high-frequency (RF) carrier signal $c$ and a data signal $b$ so as to obtain a modulated signal $d$ to be transmitted.

In this case, as shown in the phase vector graph of FIG. 5B, in addition to the normal vector of the modulated signal $d$, the obtained modulated signal $d$ contains a carrier leak component of the carrier signal $c$ which leaks into the modulated signal $d$ through the multiplier 1.

A carrier leak phenomenon in which the carrier signal $c$ leaks into the modulated signal $d$ also occurs in a quadrature modulator incorporating two multipliers in the same manner.

When, therefore, the modulated signal $d$ is demodulated into the original data signal $b$ on the receiving side, the original data signal $b$ cannot completely obtained.

FIG. 6 is a block diagram showing the schematic arrangement of a general quadrature modulator conventionally used in a data transmission system including a cellular phone.

As shown in FIG. 6, the externally input carrier signal $c$ formed from, e.g., a sine wave is input to one multiplier 2, and is also input to the other multiplier 4 after the signal is phase-shifted by a 90° phase shifter 3 by 90°.

An in-phase signal I representing an in-phase component of a baseband signal is input to one multiplier 2.

A quadrature signal Q representing a quadrature component of the baseband signal is input to the other multiplier 4.

One multiplier 2 multiplies the carrier signal $c$ and in-phase signal I to output the resultant signal as a product signal $d_1$ to an adder 5.

The other multiplier 4 multiplies the 90° phase-shifted carrier signal $c$ and quadrature signal Q to output the resultant signal as a product signal $d_2$ to the adder 5.

The adder 5 adds the product signals $d_1$ and $d_2$ respectively output from the multipliers 2 and 4, and outputs the resultant signal as a modulated signal $a$ (quadrature-modulated signal) to the exterior.

In this quadrature modulator as well, the product signals $d_1$ and $d_2$ output from the multipliers 2 and 4 respectively contain a leak vector $L_I$ leaking from the carrier signal $c$ and a leak vector $L_Q$ leaking from the signal obtained by phase-shifting the carrier signal $c$ by 90°, as shown in FIG. 7.

That is, a leak vector $V_L$ obtained by adding (vector synthesis) the product signals $d_1$ and $d_2$ is contained in the modulated signal $a$ output from this quadrature modulator.

Therefore, even while the signal levels of the I and Q signals are "0", the signal level of the modulated signal $a$ is not "0" but is equal to the level of the absolute value of the leak vector $V_L$.

In order to prevent the leak vector $V_L$ from being contained in the modulated signal $a$, an adjustment vector $V_C$ in the opposite direction to the leak vector $V_L$ may be applied (added) thereto, as shown in FIG. 7.

In order to realize the adjustment vector $V_C$, a DC adjustment voltage $E_{IC}$ and DC adjustment voltage $E_{QC}$ may be respectively added to the I and Q signals in advance in the quadrature modulator shown in FIG. 6.

More specifically, as shown in FIG. 8, adders 6 and 7 are inserted in the signal paths for the I and Q signal input to the quadrature modulator.

The same reference numeral as in FIG. 6 denote the same parts in FIG. 8.

Variable voltage sources 8 and 9 respectively apply the above DC adjustment voltages $E_{IC}$ and $E_{QC}$ to the adders 6 and 7.

A sequence for setting operation for the adjustment voltages $E_{IC}$ and $E_{QC}$ which is executed by an operator will be described next in detail.

First of all, the signal levels of the I and Q signals are set to "0" by the operator.

In this state, the operator measures the signal level of the modulated signal $a$ output from the quadrature modulator with a measurement instrument capable of measuring a very low level with high precision, such as a spectrum analyzer 11, through a high-frequency circuit 10 including an amplifier.

The operator then adjusts voltages to be applied to the I and Q signals by operating the variable voltage sources 8 and 9 with an operating section 12 while observing the signal level of the modulated signal $a$ displayed on the spectrum analyzer 11.

More specifically, the operator searches for a combination of voltages to be applied which sets the signal level of the modulated signal $a$ to "0" or minimizes it, and sets the respective voltages of the combination as the adjustment voltages $E_{IC}$ and $E_{QC}$.

However, the technique of canceling out the carrier leak contained in the modulated signal $a$ output from the quadrature modulator by using the adjustment voltages $E_{IC}$ and $E_{QC}$ added to the I and Q signals as shown in FIG. 8 still has the following problems to be solved.

While the signal levels of the I and Q signals are set at "0", the modulated signal $a$ output from the quadrature modulator contains only a carrier leak component, and hence its signal level is very low.

In order to obtain the adjustment voltages $E_{IC}$ and $E_{QC}$ with high precision which are used to cancel out the carrier leak contained in the modulated signal $a$, the very low level of the modulated signal $a$ must be measured with high precision.

A high-precision measurement instrument such as the spectrum analyzer 11 described above must be prepared to measure the very low signal level of the modulated signal $a$ with high precision.

This greatly increases the equipment cost. It is therefore almost impossible in terms of cost to incorporate such a carrier leak adjustment function in, for example, a signal generator incorporating a quadrature modulator.

In addition, an operator makes a search, by trial and error, for a combination of voltages to be added to the I and Q signal so as to set the signal level of the modulated signal a to "0" or minimize it.

This operation requires many repetitive adjustments, and hence it is difficult to automate such a carrier leak adjustment function and incorporate it in, for example, a signal generator incorporating a quadrature modulator.

Furthermore, a search for a combination of voltages to be added to the I and Q signals so as to set the signal level of the modulated signal a to "0" or minimize it has been executed by experience and intuition of a skilled operator. Therefore, this adjustment operation requires an unskilled operator to perform extremely inefficient operation demanding much time and effort.

According to a method of calibrating a vector modulator disclosed in U.S. Pat. No. 4,717,894 as a prior art, a technique of automating carrier leak calibration is disclosed, which is similar to the carrier leak adjustment function in the quadrature modulator described above.

According to this prior art, the carrier leak calibration function works as follows. First of all, DC voltages to be applied to the I and Q signals, e.g., two DC voltages to be applied to the I phase when the I phase voltage is changed to set a given RF output level are calculated. The median between these two DC voltages is then obtained.

With regard to the Q phase, two DC voltages to be applied to the Q phase when a given RF output level is set are obtained by the same procedures as those for the I phase, and the median between the voltages is obtained.

In this prior art, a carrier leak in the vector modulator is automatically calibrated by repeating these procedures.

This prior art is, however, based on not only carrier leak calibration for the vector modulator but also orthogonality adjustment of an RF carrier signal generated by an LO (Local Oscillator). For this reason, combinations of four fixed voltages I−, I+, Q−, and Q+ are respectively applied to the I and Q signals, and the values of the resultant RF output levels themselves are read to perform calculations.

In this prior art therefore, as a level detector for reading the value of an RF output level itself, a digital/analog (D/A) converter itself or the like capable of measuring a level itself is required to satisfy such procedures. Accordingly, this further complicates the overall arrangement, posing a problem in terms of cost.

Under the circumstance, a problem arises in applying such a carrier leak calibration function based on the prior art to the carrier leak adjustment function of the above quadrature modulator.

DISCLOSURE OF INVENTION

The present invention has been made in consideration of the above situation, and has as its object to provide a carrier leak adjustment point detection method for a quadrature modulator, a carrier leak adjustment method for the quadrature modulator, and a quadrature modulation apparatus, which automatically calculate a carrier leak adjustment point with high precision without requiring any expensive level measurement instrument capable of measuring even low levels and without the mediacy of an operator by calculating a carrier leak adjustment point while DC voltages are added to the I and Q signals input to the quadrature modulator, and allow even an operator who is unfamiliar with adjustment operation to efficiently execute carrier leak adjustment operation.

According to the present invention, a carrier leak adjustment point detection method for a quadrature modulator based on a geometric analytical computation technique, a carrier leak adjustment method for the quadrature modulator, and a quadrature modulation apparatus are realized.

In order to achieve the above object, according to the first aspect of the present invention, there is provided a carrier leak adjustment point detection method for a quadrature modulator for receiving a carrier signal and I and Q signals and quadrature-modulating the carrier signal with the I and Q signals, which detect DC adjustment voltages to be respectively added to the I and Q signals so as to cancel out a carrier leak contained in a modulated signal output from the quadrature modulator, comprising while signal levels of the I and Q signals are set at "0" (step P1), respectively adding, to the I and Q signals, a first pair of DC voltages which set a signal level of the modulated signal to a predetermined reference level (step P2), sequentially obtaining second and third pairs of DC voltages which set the signal level of the modulated signal to the predetermined reference level by changing the first pair of DC voltages (steps P5 and P9), deciding, based on the first, second, and third pairs of DC voltages, at least three measurement points based on a combination of pairs of DC voltages which sets the signal level of the modulated signal to the predetermined reference level (steps P4, P8, and P12), and assuming that the first, second, and third pairs of DC voltages which provide at least three decided measurement points are located on a circumference of a single virtual circle drawn on a two-dimensional coordinate system with a pair of DC voltages to be respectively added to the I and Q signals being plotted as an ordinate and an abscissa, and calculating coordinates of the center of the virtual circle as the carrier leak adjustment point (steps P13, P14, and P15).

In order to achieve the above object, according to the second aspect of the present invention, there is provided a carrier leak adjustment point detection method for a quadrature modulator according to the first aspect, wherein when the first pair of DC voltages are to be changed, the second pair of DC voltages are obtained by fixing one of the pair of DC voltages to be added to the I and Q signals which is added to one signal and changing the voltage added to another signal (step P5), and the third pair of DC voltages are obtained by fixing the voltage added to the other signal and changing the voltage added to one signal (step P6).

In order to achieve the above object, according to the third aspect of the present invention, there is provided a carrier leak adjustment point detection method for a quadrature modulator according to the first aspect, wherein when the first, second, and third pairs of DC voltages located on the circumference of the virtual circle are set as at least three measurement points $B_1$, $B_2$, and $B_3$, in calculating the coordinates of the center of the virtual circle as the carrier leak adjustment point, a first orthogonal bisector $y_1$ which is orthogonal to a line segment $B_1B_2$ and bisects the line segment $B_1B_2$ is calculated first (step P13), a second orthogonal bisector $y_2$ which is orthogonal to a line segment $B_2B_3$ and bisects the line segment $B_2B_3$ is then calculated (step P14), and coordinates of an intersection of the first and second orthogonal bisectors $y_1$ and $y_2$ are obtained as the coordinates of the center of the virtual circle (step P15).

In order to achieve the above object, according to the fourth aspect of the present invention, there is provided a carrier leak adjustment method for a quadrature modulator for receiving a carrier signal and I and Q signals and quadrature-modulating the carrier signal with the I and Q signals, which cancels out a carrier leak contained in a modulated signal output from the quadrature modulator by respectively adding DC adjustment voltages to the I and Q signals, comprising while signal levels of the I and Q signals are set at "0" (step P1), respectively adding, to the I and Q signals, a first pair of DC voltages which set a signal level of the modulated signal to a predetermined reference level (step P2), sequentially obtaining second and third pairs of DC voltages which set the signal level of the modulated signal to the predetermined reference level by changing the first pair of DC voltages (steps P6 and P8), deciding, based on the first, second, and third pairs of DC voltages, at least three measurement points based on a combination of pairs of DC voltages which sets the signal level of the modulated signal to the predetermined reference level (steps P4, P8, and P12), assuming that the first, second, and third pairs of DC voltages which provide at least three decided measurement points are located on a circumference of a single virtual circle drawn on a two-dimensional coordinate system with a pair of DC voltages to be respectively added to the I and Q signals being plotted as an ordinate and an abscissa, and calculating coordinates of the center of the virtual circle as the carrier leak adjustment point (steps P13, P14, and P15), and respectively adding, to the I and Q signals, a pair of DC voltages as adjustment voltages which specify the coordinates of the calculated carrier leak adjustment point (step P16).

In order to achieve the above object, according to the fifth aspect of the present invention, there is provided a carrier leak adjustment method for a quadrature modulator according to the fourth aspect, wherein when the first pair of DC voltages are to be changed, the second pair of DC voltages are obtained by fixing one of the pair of DC voltages to be added to the I and Q signals which is added to one signal and changing the voltage added to another signal (step P5), and the third pair of DC voltages are obtained by fixing the voltage added to the other signal and changing the voltage added to one signal (step P6).

In order to achieve the above object, according to the sixth aspect of the present invention, there is provided a carrier leak adjustment method for a quadrature modulator according to the fourth aspect, wherein when the first, second, and third pairs of DC voltages located on the circumference of the virtual circle are set as at least three measurement points $B_1$, $B_2$, and $B_3$, in calculating the coordinates of the center of the virtual circle as the carrier leak adjustment point, a first orthogonal bisector $y_1$ which is orthogonal to a line segment $B_1B_2$ and bisects the line segment $B_1B_2$ is calculated first (step P13), a second orthogonal bisector $y_2$ which is orthogonal to a line segment $B_2B_3$ and bisects the line segment $B_2B_3$ is then calculated (step P14), and coordinates of an intersection of the first and second orthogonal bisectors $y_1$ and $y_2$ are obtained as the coordinates of the center of the virtual circle (step P15).

In order to achieve the above object, according to the seventh aspect of the present invention, there is provided a quadrature modulation apparatus comprising:

a quadrature modulator body (14) which receives a carrier signal and I and Q signals, quadrature-modulates the carrier signal with the I and Q signals, and outputs the carrier signal as a modulated signal, a level detecting section (16) which detects a signal level of the modulated signal output from the quadrature modulator body, a pair of variable voltage sources (8, 9) which generate at least first, second, and third pairs of DC voltages which are a plurality of pairs of DC voltages to be respectively added to the I and Q signals and each of which sets the signal level of the modulated signal to a predetermined reference level, a voltage addition instructing section (24) which sequentially adds the first, second, and third pairs of DC voltages generated by the pair of variable voltage sources to the I and Q signals, respectively, while the signal levels of the I and Q signals are set at "0", a reference level determining section (20) which determines that signal levels of the modulated signal detected by the level detecting section become the predetermined reference level in a state in which the first, second, and third pairs of DC voltages generated by the pair of variable voltage sources are respectively added to the I and Q signals based on instructions from the voltage addition instructing section, a measurement point deciding section (21) which decides at least three measurement points based on a combination of pairs of DC voltages which set the signal level of the modulated signal to the predetermined reference level in a state in which the reference level determining section determines that the signal levels of the modulated signal which correspond to the first, second, and third pairs of DC voltages are set to the predetermined reference level, an adjustment point calculating section (22) which assumes that the first, second, and third pairs of DC voltages which provide at least three measurement points decided by the measurement point deciding section are located on a circumference of a single virtual circle drawn on a two-dimensional coordinate system with a pair of DC voltages to be respectively added to the I and Q signals being plotted as an ordinate and an abscissa, and calculates coordinates of the center of the virtual circle as the carrier leak adjustment point, and an adjustment voltage addition instructing section (23) which gives an instruction to respectively add, to the I and Q signals through the pair of variable voltage sources, a pair of DC voltages as adjustment voltages which specify the coordinates of the carrier leak adjustment point calculated by the adjustment point calculating section.

In order to achieve the above object, according to the eighth aspect of the present invention, there is provided a quadrature modulation apparatus according to the seventh aspect, wherein when the second and third pairs of DC voltages are to be generated, the pair of variable voltage sources obtain the second pair of DC voltages by fixing one of the first pair of DC voltages to be added to the I and Q signals which is added to one signal and changing the voltage added to another signal, and obtain the third pair of DC voltages by fixing the voltage added to the other signal and changing the voltage added to one signal.

In order to achieve the above object, according to the ninth aspect of the present invention, there is provided a quadrature modulation apparatus according to the seventh aspect, wherein when the first, second, and third pairs of DC voltages located on the circumference of the virtual circle are set as at least three measurement points $B_1$, $B_2$, and $B_3$, in calculating the coordinates of the center of the virtual circle as the carrier leak adjustment point, the adjustment point calculating section calculates first a first orthogonal bisector $y_1$ which is orthogonal to a line segment $B_1B_2$ and bisects the line segment $B_1B_2$, then calculates a second orthogonal bisector $y_2$ which is orthogonal to a line segment $B_2B_3$ and bisects the line segment $B_2B_3$, and obtains coordinates of an intersection of the first and second orthogonal bisectors $y_1$ and $y_2$ as the coordinates of the center of the virtual circle.

In order to achieve the above object, according to the tenth aspect of the present invention, there is provided a quadrature modulation apparatus according to the seventh aspect, wherein a modulated signal output from the quadrature modulator body is supplied to the level detecting section through a high-frequency circuit including an amplifier.

In order to achieve the above object, according to the eleventh aspect of the present invention, there is provided a quadrature modulation apparatus according to the seventh aspect, wherein a modulated signal output from the quadrature modulator body is supplied to the reference level determining section, after a level of the modulated signal is detected by the level detecting section, through a level reading section (18) which reads the level of the modulated signal and analog/digital-converts or binarizes the level.

In order to achieve the above object, according to the twelfth aspect of the present invention, there is provided a quadrature modulation apparatus comprising:

a quadrature modulator body (14) which receives a carrier signal and I and Q signals, quadrature-modulates the carrier signal with the I and Q signals, and outputs the carrier signal as a modulated signal, level detecting means (16) for detecting a signal level of the modulated signal output from the quadrature modulator body, a pair of variable voltage sources (8, 9) which generate at least first, second, and third pairs of DC voltages which are a plurality of pairs of DC voltages to be respectively added to the I and Q signals and each of which sets the signal level of the modulated signal to a predetermined reference level, voltage addition instructing means (24) for sequentially adding the first, second, and third pairs of DC voltages generated by the pair of variable voltage sources to the I and Q signals, respectively, while the signal levels of the I and Q signals are set at "0", reference level determining means (20) for determining that signal levels of the modulated signal detected by the level detecting section become the predetermined reference level in a state in which the first, second, and third pairs of DC voltages generated by the pair of variable voltage sources are respectively added to the I and Q signals based on instructions from the voltage addition instructing means, measurement point deciding means (21) for deciding at least three measurement points based on a combination of pairs of DC voltages which set the signal level of the modulated signal to the predetermined reference level in a state in which the reference level determining means determines that the signal levels of the modulated signal which correspond to the first, second, and third pairs of DC voltages are set to the predetermined reference level, adjustment point calculating means (22) for assuming that the first, second, and third pairs of DC voltages which provide at least three measurement points decided by the measurement point deciding means are located on a circumference of a single virtual circle drawn on a two-dimensional coordinate system with a pair of DC voltages to be respectively added to the I and Q signals being plotted as an ordinate and an abscissa, and calculating coordinates of the center of the virtual circle as the carrier leak adjustment point, and adjustment voltage addition instructing means (23) for giving an instruction to respectively add, to the I and Q signals through the pair of variable voltage sources, a pair of DC voltages as adjustment voltages which specify the coordinates of the carrier leak adjustment point calculated by the adjustment point calculating means.

In order to achieve the above object, according to the thirteenth aspect of the present invention, there is provided a quadrature modulation apparatus according to the 12th aspect, wherein when the second and third pairs of DC voltages are to be generated, the pair of variable voltage sources obtain the second pair of DC voltages by fixing one of the first pair of DC voltages to be added to the I and Q signals which is added to one signal and changing the voltage added to another signal, and obtain the third pair of DC voltages by fixing the voltage added to the other signal and changing the voltage added to one signal.

In order to achieve the above object, according to the fourteenth aspect of the present invention, there is provided a quadrature modulation apparatus according to the 12th aspect, wherein when the first, second, and third pairs of DC voltages located on the circumference of the virtual circle are set as at least three measurement points $B_1$, $B_2$, and $B_3$, in calculating the coordinates of the center of the virtual circle as the carrier leak adjustment point, the adjustment point calculating means calculates first a first orthogonal bisector $y_1$ which is orthogonal to a line segment $B_1B_2$ and bisects the line segment $B_1B_2$, then calculates a second orthogonal bisector $y_2$ which is orthogonal to a line segment $B_2B_3$ and bisects the line segment $B_2B_3$, and obtains coordinates of an intersection of the first and second orthogonal bisectors $y_1$ and $y_2$ as the coordinates of the center of the virtual circle.

In order to achieve the above object, according to the fifteenth aspect of the present invention, there is provided a quadrature modulation apparatus according to the 12th aspect, wherein a modulated signal output from the quadrature modulator body is supplied to the level detecting means through a high-frequency circuit including an amplifier.

In order to achieve the above object, according to the sixteenth aspect of the present invention, there is provided a quadrature modulation apparatus according to the 12th aspect, wherein a modulated signal output from the quadrature modulator body is supplied to the reference level determining means, after a level of the modulated signal is detected by the level detecting section, through level reading means (18) which reads the level of the modulated signal and analog/digital-converts or binarizes the level.

BRIEF DESCRIPTION OF DRAWINGS

FIG. 5A is a view showing an example of obtaining a modulated signal $d$ to be transmitted by multiplying a high-frequency (RF) carrier signal $c$ and data signal $b$ to explain a carrier leak in a modulator conventionally used in a data transmission system or the like;

BEST MODE FOR CARRYING OUT THE INVENTION

A carrier leak adjustment point detection method for a quadrature modulator based on a geometric analytical computation technique, a carrier leak adjustment method for the quadrature modulator, and the operation principle of the quadrature modulation apparatus according to the present invention will be described first with reference to FIGS. 4A and 4B.

Figure 4A:
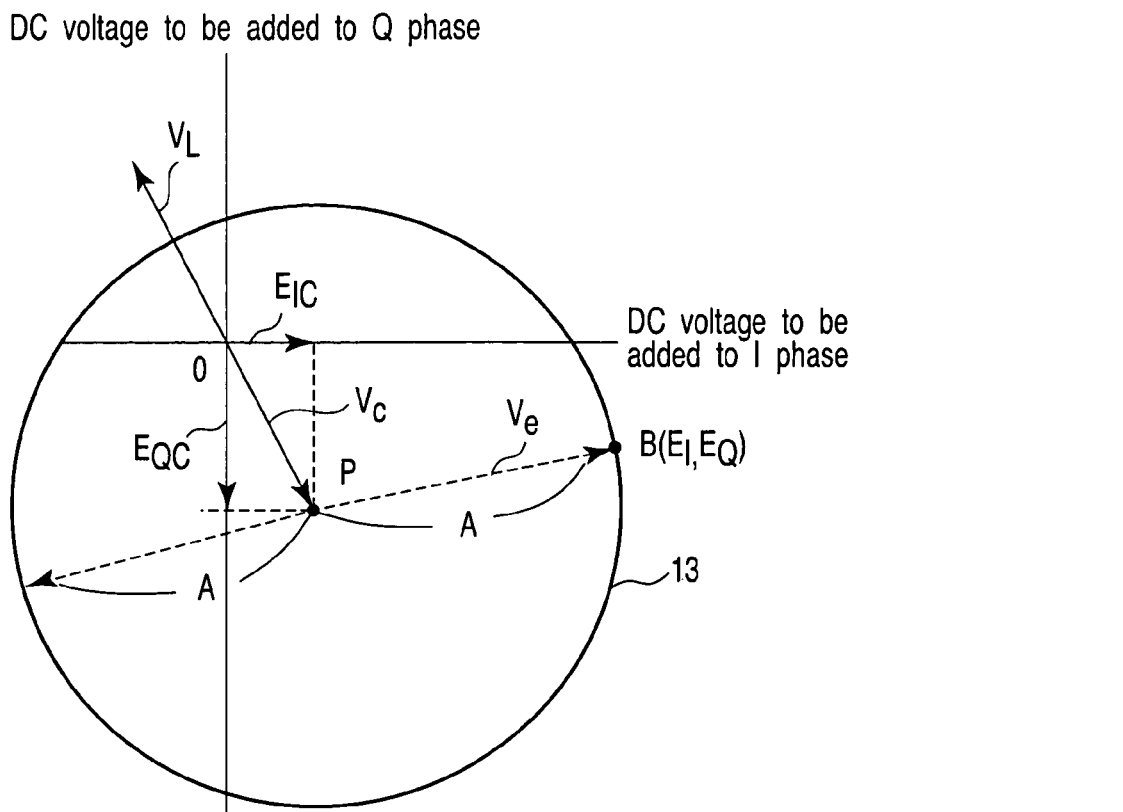
FIGS. 4A and 4B views for explaining the operation principle of carrier leak adjustment in the quadrature apparatus in FIG. 1.

As shown in FIG. 4A, in a quadrature modulator which receives a carrier signal and I and Q signals and quadrature-modulates the carrier signal with the I and Q signals, the modulated signal output from the quadrature modulator (quadrature modulator body) contains a leak vector $V_L$ due to a carrier leak even in a state wherein the signal levels of the I and Q signals are maintained at "0", as described above.

As also described above, an adjustment vector $V_C$ is required to cancel out the leak vector $V_L$.

The tip of the adjustment vector $V_C$ is an adjustment point P serving as a carrier leak adjustment point in the present invention.

Assume that DC adjustment voltages $E_{IC}$ and $E_{QC}$ corresponding to the adjustment vector $V_C$ are added to the I and Q signals. In this state, in the modulated signal, the leak vector $V_L$ due to a carrier leak is canceled out by the adjustment vector $V_C$, and hence does not appear.

After carrier leak adjustment in which the adjustment voltage $E_{IC}$ and $E_{QC}$ corresponding to the adjustment vector $V_C$ are added to the I and Q signals, the signal level of the modulated signal is "0".

A sequence required to obtain the DC adjustment voltages $E_{IC}$ and $E_{QC}$ corresponding to the adjustment vector $V_C$ will be described next.

When a DC voltage having a certain value is added to each of the I and Q signals while the signal levels of the I and Q signals are maintained at "0", a vector $V_e$ corresponding to this voltage appears at the tip of the leak vector $V_L$ as a start point.

In this case, a signal level A of the modulated signal corresponds to the absolute value of the sum of the vector $V_e$ and leak vector $V_L$.

In other words, the loci of the I and Q signal voltages obtained by adding a DC voltage (DC) having a certain value to each of the I and Q signals while the signal level A of the modulated signal output from the quadrature modulator (quadrature modulator body) is fixed to an arbitrarily determined reference level $A_S$ are located on the circumference of a single virtual circle 13 drawn on a two-dimensional coordinate system with the pair of DC voltages added to the I and Q signals being regarded as an ordinate and abscissa, respectively.

In this case, the position of the tip B of the vector $v_e$ is represented by DC voltages $E_I$ and $E_Q$ with a certain value which has been added to the I and Q signals at this time.

If, therefore, tips B (measurement points) of at least three vectors $v_e$ on the circumference of the virtual circle 13 are obtained, the center of the virtual circle 13, i.e., the adjustment point P at the tip of the adjustment vector $V_C$, can be obtained with single geometric consideration.

This is because, according to a geometric theorem, if at least three positions on the same circumference are known, the center of the circle can be obtained.

Figure 4B:
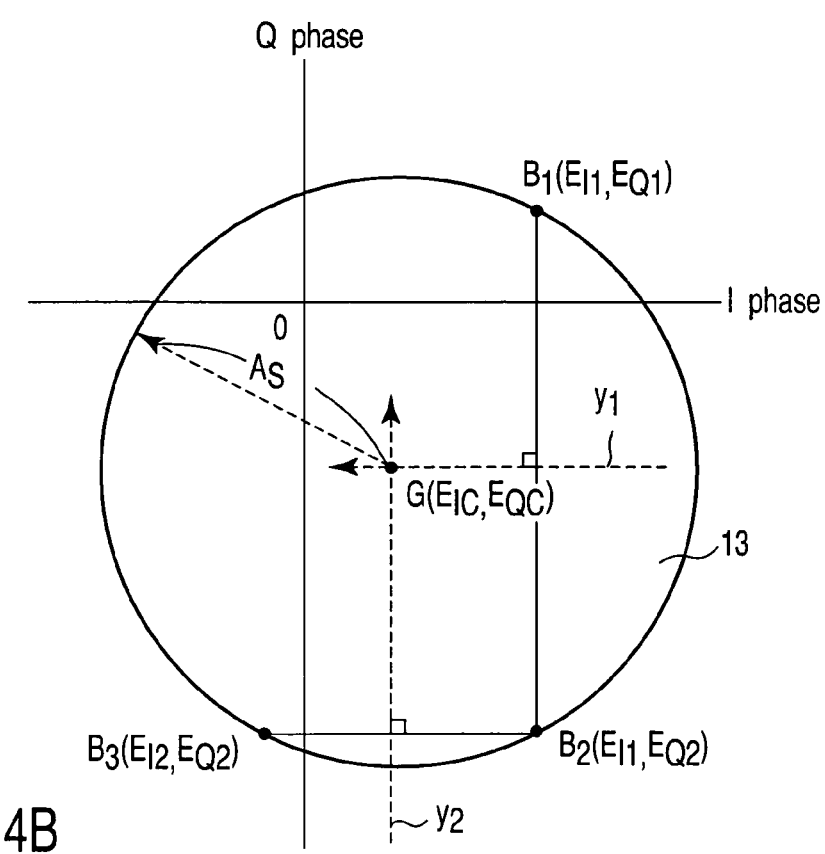
Figure 5A:
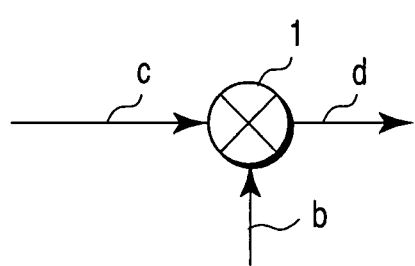
Figure 5B:
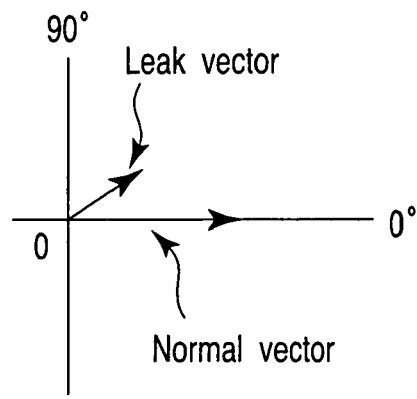
FIG. 5B is a phase vector graph showing the normal vector and leak vector of the modulated signal d obtained by the modulator in FIG. 5A to explain a carrier leak in the modulator in FIG. 5A.
Figure 6:
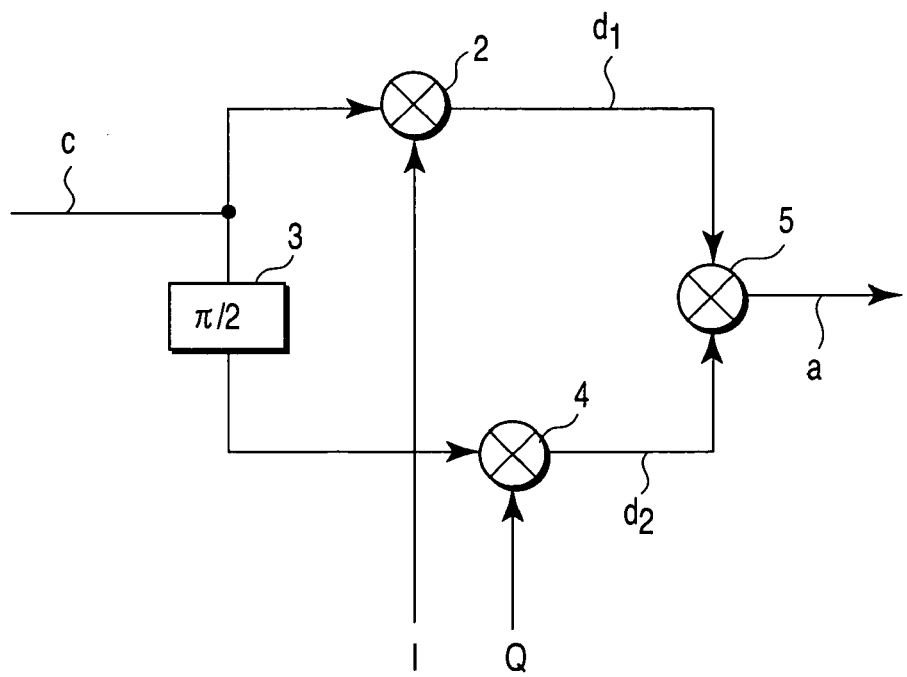
FIG. 6 is a block diagram showing the schematic arrangement of a general quadrature modulator conventionally used in a data transmission system or the like including a cell phone.
Figure 7:
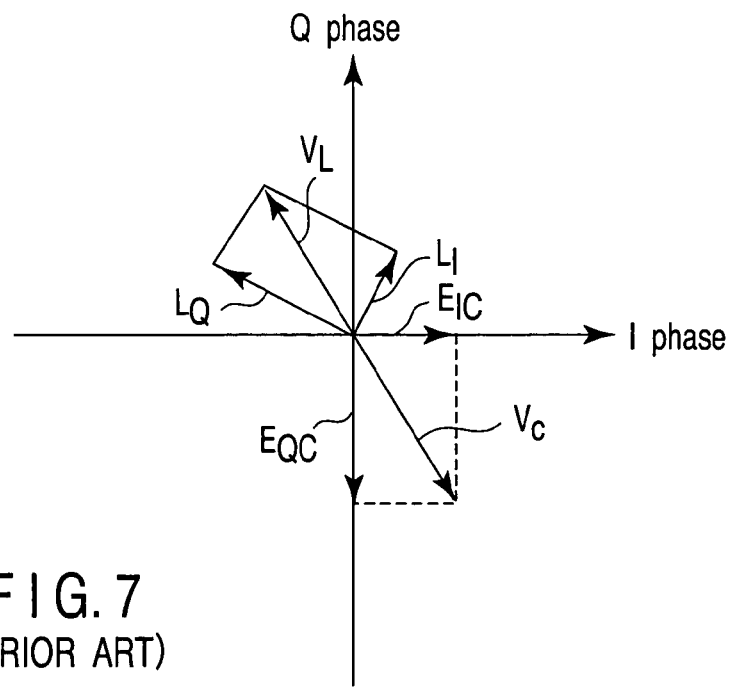
FIG. 7 is a vector graph for explaining a leak vector due to a carrier leak in the associative memory in FIG. 6 and an adjustment vector.

As shown in FIG. 4B, coordinates ($E_{IC}$, $E_{QC}$) of a center G of the circuit 13 is obtained from three $B_1$, $B_2$, and $B_3$ on the circumference of the circuit 13.

More specifically, an orthogonal bisector $y_1$ that is orthogonal to a line segment $B_1B_2$ and bisects it is calculated first.

An orthogonal bisector $y_2$ that is orthogonal to a line segment $B_2B_3$ and bisects it is calculated next.

The coordinates ($E_{IC}$, and $E_{QC}$) of the center G of the circle 13 represented by the coordinates of the intersection of the two orthogonal bisectors $y_1$ and $y_2$ are obtained.

Note that this operation will be described in detail in association with actual calculation processing of the adjustment point P to be described later.

When the adjustment point P of the adjustment vector $V_C$ is obtained in this manner, the adjustment voltage $E_{IC}$ to be added to the I signal is obtained from the I-phase coordinate of the adjustment point P.

In addition, the adjustment voltage $E_{QC}$ to be added to the Q signal is obtained from the Q-phase coordinate of the adjustment point P.

In this case, setting the DC voltages $E_I$ and $E_Q$ added to the I and Q signals allows the reference level $A_S$ to be set to a large value for the signal level A of the modulated signal output from the quadrature modulator (quadrature modulator body).

As a consequence, the present invention need not use any expensive measurement instrument capable of measuring very low levels with high precision, e.g., the above spectrum analyzer, as a measurement instrument for measuring the signal level of this modulated signal.

In addition, according to the present invention, since the adjustment point P of the adjustment vector $V_C$ is automatically calculated by the above geometric analytical computation technique, the adjustment processing efficiency for carrier leaks can be improved.

An embodiment of the present invention will be described below with reference to the several views of the accompanying drawing.

Figure 1:
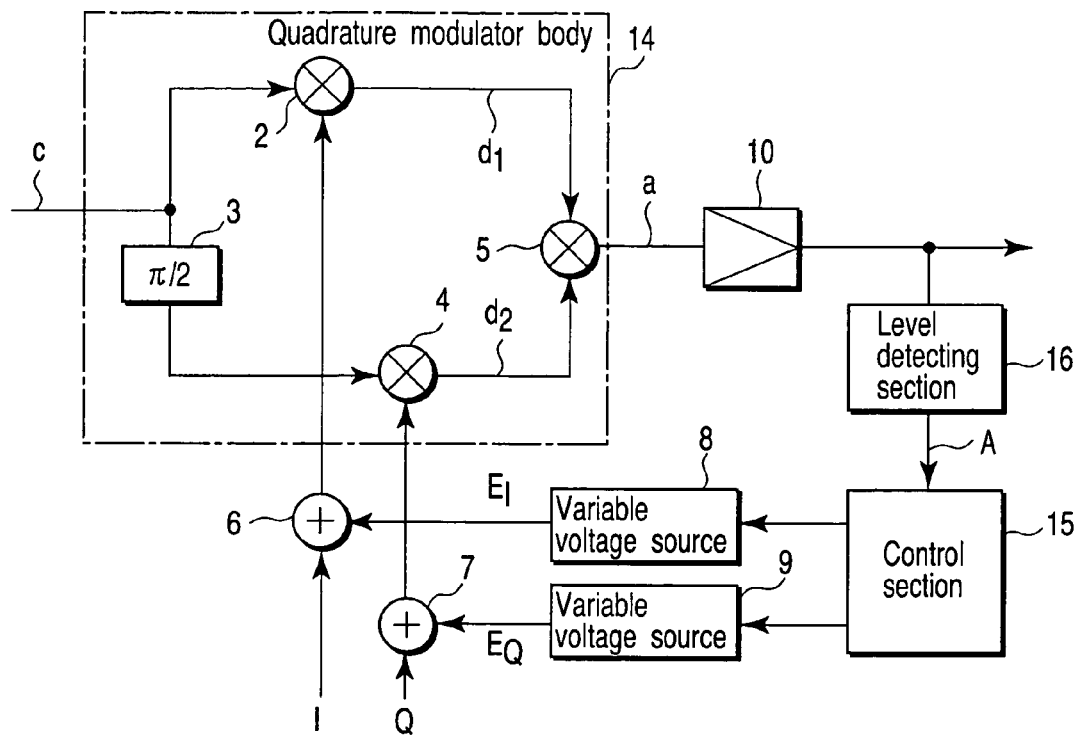
FIG. 1 is a block diagram showing the schematic arrangement of a quadrature modulation apparatus to which a carrier leak adjustment point detection method and carrier leak adjustment method for a quadrature modulator according to an embodiment of the present invention are applied.

FIG. 1 is a block diagram showing the schematic arrangement of a quadrature modulation apparatus to which a carrier leak adjustment detection method and carrier leak adjustment method for the quadrature modulator according to an embodiment of the present invention are applied.

Figure 8:
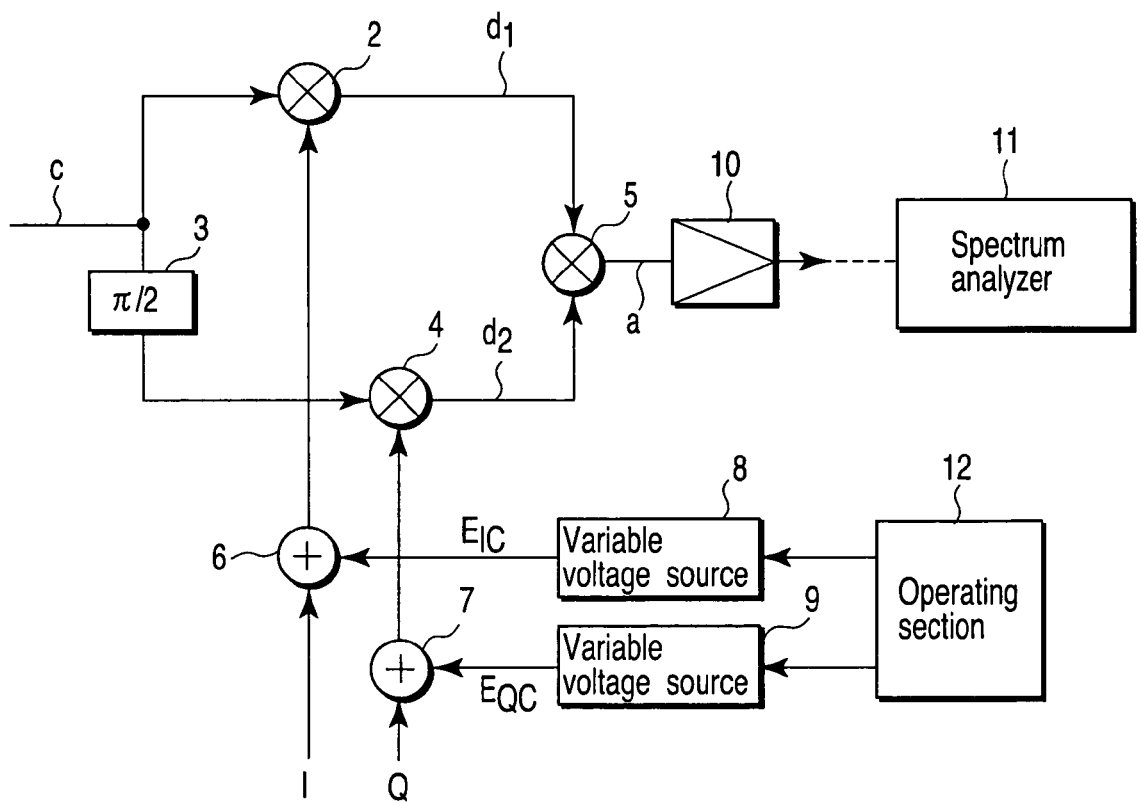
FIG. 8 is a block diagram showing the schematic arrangement of a conventional quadrature modulator which has a carrier leak adjusting section to explain a carrier leak adjustment method for the quadrature modulator in FIG. 6.

The same reference numerals as in FIG. 1 denote the same parts of the quadrature modulator in FIG. 8, and a repetitive description will be omitted.

As shown in FIG. 1, an externally input carrier signal c is input to one multiplier 2 in a quadrature modulator body 14, and is also input to the other multiplier 4 after the signal is phase-shifted by a 90° phase shifter 3 by 90°.

The I signal representing the in-phase component of a baseband signal is input to one multiplier 2.

The Q signal representing the quadrature component of the baseband signal is input to the other multiplier 4.

One multiplier 2 multiples the carrier signal c and I signal and outputs the resultant signal as a product signal $d_1$ to an adder 5.

The multiplier 4 multiplies the 90°-shifted carrier signal c and Q signal and outputs the resultant signal as a product signal $d_2$ to the adder 5.

The adder 5 adds the product signals $d_1$ and $d_2$ output from the multipliers 2 and 4 and outputs the resultant signal as a modulated signal a to a high-frequency circuit 10 including an amplifier (to be described later).

Adders 6 and 7 are respectively inserted in the signal paths for the I and Q signals which are connected to the quadrature modulator body 14.

Variable voltage sources 8 and 9 respectively apply the DC voltages $E_I$ and $E_Q$ to the adders 6 and 7.

The DC voltages $E_I$ and $E_Q$ to be respectively applied from the variable voltage sources 8 and 9 to the I and Q signals are controlled by a control section 15 constituted by a computer (CPU) and the like.

The modulated signal a output from the quadrature modulator body 14 is sent out the exterior through the high-frequency circuit 10 including the amplifier, and is also input to a level detecting section 16.

The level detecting section 16 detects the signal level A of the input modulated signal a and sends it out to the control section 15.

Figure 2:
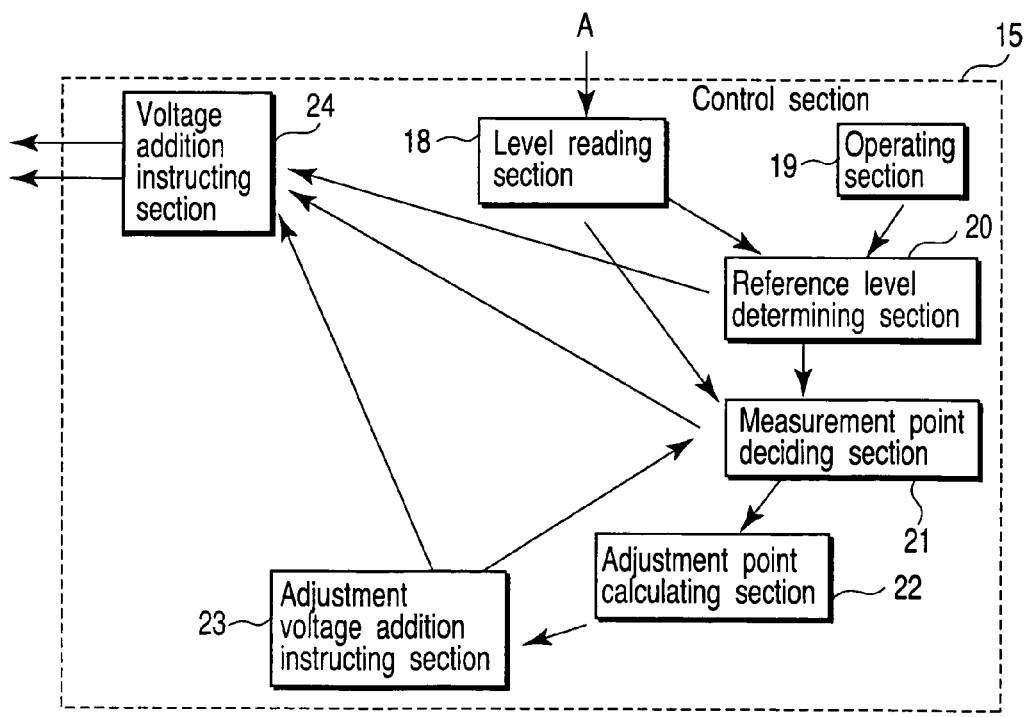
FIG. 2 is a functional block diagram showing the detailed arrangement of a control section incorporated in the quadrature modulation apparatus in FIG. 1.

FIG. 2 is a functional block diagram showing the schematic arrangement of the control section 15 constituted by a computer (CPU) and the like.

The control section 15 incorporates hardware circuits such as a voltage addition instructing section 24 for setting the DC voltages $E_I$ and $E_Q$ to be added to the I and Q signals with respect to the variable voltage sources 8 and 9, and a level reading section 18 for reading the level of the modulated signal a detected by the level detecting section 16 and performing analog/digital (A/D) conversion or binarization of the read level.

The control section 15 incorporates a reference level determining section 20, measurement point deciding section 21, adjustment point calculating section 22, adjustment voltage addition instructing section 23, and the like which are formed in application programs.

Figure 3:
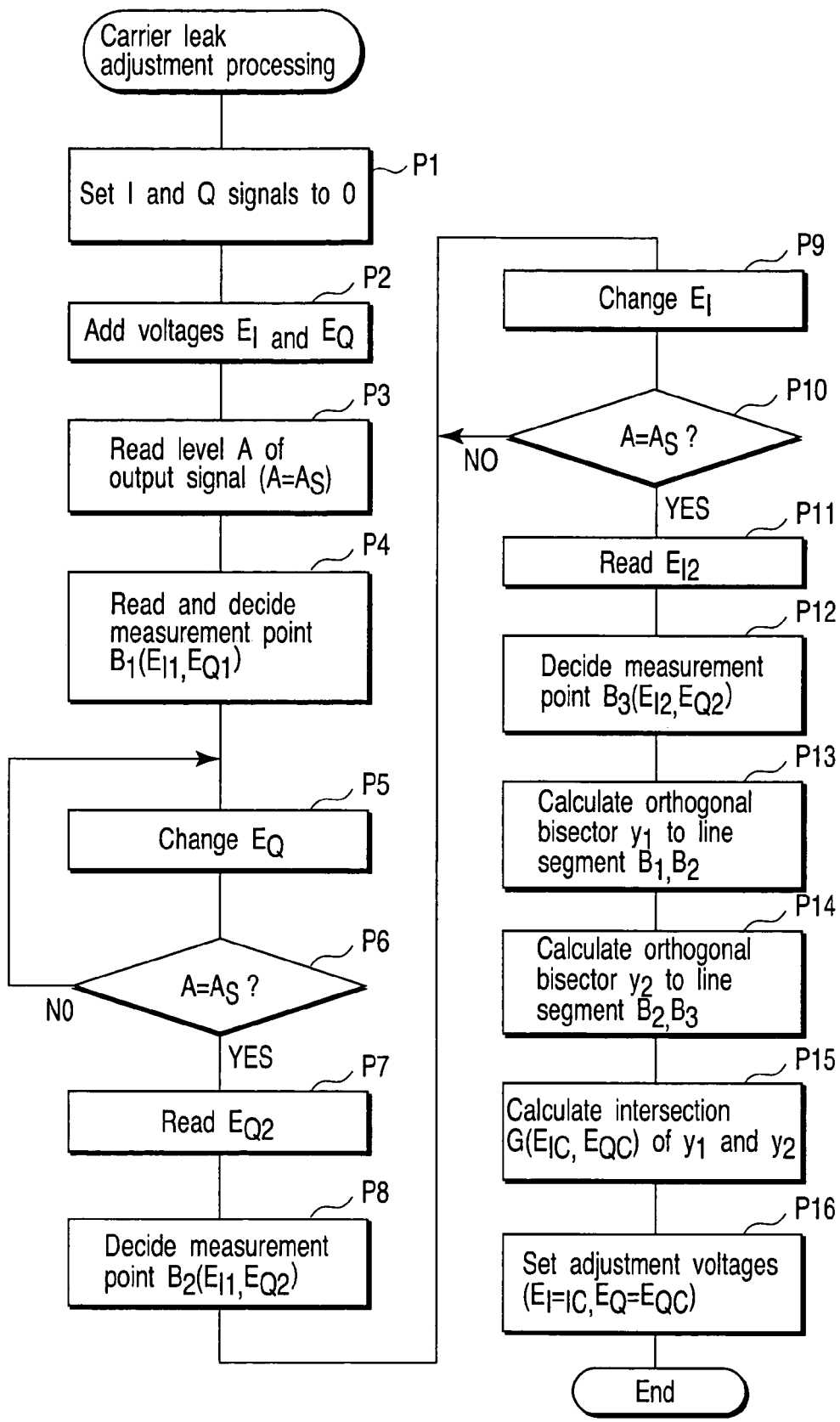
FIG. 3 is a flow chart for explaining carrier leak adjustment operation in the quadrature apparatus in FIG. 1.

The sections 18, 19, 20, 21, 22, 23, and 24 of the control section 15 execute adjustment processing for carrier leaks in accordance with the flow chart shown in FIG. 3.

First of all, an operator sets the signal levels of the I and Q signals input to the quadrature modulator body 14 to "0".

More specifically, the externally input I and Q signals are cut off and the input terminals for the I and Q signals are terminated (step P1).

The level reading section 18, reference level determining section 20, and voltage addition instructing section 24 in the control section 15 control the variable voltage sources 8 and 9 to add the DC voltages $E_I$ and $E_Q$ to the I and Q signals such that it is determined that the level A of the modulated signal a output from the quadrature modulator body 14 is equal to the reference signal level $A_S$ (step P2).

In this case, since the DC voltages $E_I$ and $E_Q$ are respectively added to the I and Q signals, the reference signal level As of the modulated signal a output from the quadrature modulator body 14 has become a value significantly larger than the absolute value of the adjustment vector $V_C$ to be measured (step P3).

The measurement point deciding section 21 is then activated to read voltages $E_{I1}$ and $E_{Q1}$ currently added to the I and Q signals, as shown in FIG. 4B, thereby determining a first measurement point $B_1(E_{I1}, E_{Q1})$ (step P4).

The first measurement point $B_1(E_{I1}, E_{Q1})$ is located on the circumference of the virtual circle 13 which has a radius $A_S$ and is centered on the adjustment point P (center G) in the I-phase·Q-phase coordinate system.

Of the DC voltages $E_{I1}$ and $E_{Q1}$ currently added to the I and Q signals, the voltage $E_{I1}$ added to the I signal is fixed. In this state, while a voltage $E_Q$ added to the Q signal is changed (step P5), the signal level A of the modulated signal a is observed.

When the signal level A coincides with the reference level $A_S$ again (step P6), a DC voltage $E_{Q2}$ added to the Q signal at this time is read (step P7), and a second measurement point $B_2(E_{I1}, E_{Q2})$ is determined (step P8).

The second measurement point $B_2(E_{I1}, E_{Q2})$ is also located on the circumference of the virtual circle 13 centered on the adjustment point P (center G).

Of the DC voltages $E_{I1}$ and $E_{Q2}$ currently added to the I and Q signals, the voltage $E_{Q2}$ added to the Q signal is fixed. In this state, while a voltage $E_1$ added to the I signal is changed (step P9), the signal level A of the modulated signal a is observed.

When the signal level A coincides with the reference level $A_S$ again (step P10), a DC voltage $E_{I2}$ added to the Q signal at this time is read (step P11), and a third measurement point $B_3(E_{I2}, E_{Q2})$ is determined (step P12).

The third measurement point $B_3(E_{I2}, E_{Q2})$ is also located on the circumference of the virtual circle 13 centered on the adjustment point P (center G).

When the adjustment point calculating section 22 is activated, calculation processing of the adjustment point P is performed.

Coordinates ($E_{IC}$, $E_{QC}$) of the center G of the virtual circle 13 are obtained from the three measurement points $B_1$, $B_2$, and $B_3$ located on the circumference of the virtual circle 13.

More specifically, the orthogonal bisector $y_1$ which is orthogonal to the line segment $B_1B_2$ and bisects it is calculated first (step P13).

Subsequently, the orthogonal bisector $y_2$ which is orthogonal to the line segment $B_2B_3$ and bisects it is calculated (step P14).

The coordinates ($E_{IC}$, $E_{QC}$) of the center G of the virtual circle 13, which are indicated by the coordinates of the intersection of the two orthogonal bisectors $y_1$ and $y_2$, are obtained (step P15).

When the adjustment voltage addition instructing section 23 is activated next, the center G ($E_{IC}$, $E_{QC}$) of the virtual circle 13 is set as an adjustment point P ($E_{IC}$, $E_{QC}$) at the tip of the adjustment vector $V_C$ for canceling out the leak vector $V_L$ due to a carrier leak, as shown in FIG. 4A.

The voltages $E_{IC}$ and $E_{QC}$ constituting the coordinates ($E_{IC}$, $E_{QC}$) of the adjustment point P are added, as the DC adjustment voltages $E_{IC}$ and $E_{QC}$, from the voltage addition instructing section 24 to the I and Q signals through the variable voltage sources 8 and 9 (step P16).

With the above operation, the carrier leak adjustment processing is finished by the control section 15 constituted by a computer (CPU) and the like. By inputting the carrier signal c and I and Q signals to the quadrature modulator body 14 while the respective adjustment voltages $E_{IC}$ and $E_{QC}$ are added to the I and Q signals through the variable voltage sources 8 and 9, the modulated signal a which is modulated with the I and Q signals and has no carrier leak is output from the quadrature modulator body 14.

In the quadrature modulation apparatus having the above arrangement to which the carrier leak adjustment point detection method and carrier leak adjustment method according to the embodiment of the present invention are applied, since the leak vector $V_L$ due to a carrier leak contained in the modulated signal a output from the quadrature modulator body 14 is canceled out by the adjustment vector $V_C$, the signal level A of the output modulated signal a contains no component due to a carrier leak. This makes it possible to further improve the signal quality of the modulated signal a.

The above embodiment of the present invention adopts the technique of obtaining the adjustment point ($E_{IC}$, $E_{QC}$) at the tip of the adjustment vector $V_C$ for canceling out the leak vector $V_L$ due to a carrier leak uses the reference level $A_S$ which allows even a low-cost level detector capable of detecting only high levels to measure the signal level A of the output modulated signal a with a sufficiently high precision.

The embodiment of the present invention therefore need not measure the absolute value of the small adjustment vector $V_C$ with a high-precision measurement instrument such as the spectrum analyzer 11 unlike the prior art. As shown in FIG. 1, therefore, the overall carrier leak adjustment function can be incorporated in a single quadrature modulation apparatus, together with the quadrature modulator body 14.

The embodiment of the present invention uses, as a technique of obtaining the adjustment point P ($E_{IC}$, $E_{QC}$) at the tip of the adjustment vector $V_C$ for canceling out the leak vector $V_L$, a technique of automatically obtaining the adjustment point P ($E_{IC}$, $E_{QC}$) from the three measurement points $B_1$, $B_2$, and $B_3$ at which the signal level A of the modulated signal a has an arbitrarily set reference level $A_S$ by a geometric analytical computation instead of the conventional manual technique based on trail and error by an operator.

As described above, according to the embodiment of the present invention, since carrier leak adjustment can be automatically executed, the operation efficiency of carrier leak adjustment can be greatly improved.

In addition, according to the embodiment of the present invention, even an operator who is unfamiliar with carrier leak adjustment operation can easily complete carrier leak adjustment operation within a short period of time.

Note that the present invention is not limited to the above embodiment.

For example, in obtaining the coordinates ($E_{IC}$, $E_{QC}$) of the center G of the virtual circle 13 from the three measurement points $B_1$, $B_2$, and $B_3$ located on the circumference of the virtual circle 13, the three measurement points $B_1$, $B_2$, and $B_3$ located on the circumference of the virtual circle 13 may be determined (selected) such that the three measurement points $B_1$, $B_2$, and $B_3$ constitute a right triangle. This makes it possible to use the fact that the bisecting point of the base of this right triangle coincides with the center G of the virtual circle 13.

As has been described above, in the carrier leak adjustment point detection method for the quadrature modulator, the carrier leak adjustment method, and the quadrature modulation apparatus according to the present invention, a carrier leak adjustment point is automatically calculated by a geometric analytical computation while DC voltages are added to the I and Q signals.

According to the present invention, therefore, there is no need to use an expensive level measurement instrument capable of measuring even low levels to measure the signal level of an output modulated signal, and a carrier leak adjustment point is automatically calculated with high precision without any operator. This allows even an operator who is unfamiliar with adjustment operation to efficiently execute carrier leak adjustment operation.

The invention claimed is:

1. A carrier leak adjustment point detection method for a quadrature modulator for receiving a carrier signal and I and Q signals and quadrature-modulating the carrier signal with the I and Q signals, which detect DC adjustment voltages to be respectively added to the I and Q signals so as to cancel out a carrier leak contained in a modulated signal output from the quadrature modulator, comprising:

respectively adding, to the I and Q signals, a first pair of DC voltages which set a signal level of the modulated signal to a predetermined reference level while signal levels of the I and Q signals are set at "0";

sequentially obtaining second and third pairs of DC voltages which set the signal level of the modulated signal to the predetermined reference level by changing the first pair of DC voltages;

deciding, based on the first, second, and third pairs of DC voltages, at least three measurement points based on a combination of pairs of DC voltages which sets the signal level of the modulated signal to the predetermined reference level; and assuming that the first, second, and third pairs of DC voltages which provide at least three decided measurement points are located on a circumference of a single virtual circle drawn on a two-dimensional coordinate system with a pair of DC voltages to be respectively added to the I and Q signals being plotted as an ordinate and an abscissa, and calculating coordinates of the center of the virtual circle as the carrier leak adjustment point.

2. A carrier leak adjustment point detection method for a quadrature modulator according to claim 1, wherein when the first pair of DC voltages are to be changed, the second pair of DC voltages are obtained by fixing one of the pair of DC voltages to be added to the I and Q signals which is added to one signal and changing the voltage added to another signal, and the third pair of DC voltages are obtained by fixing the voltage added to the other signal and changing the voltage added to said one signal.

3. A carrier leak adjustment point detection method for a quadrature modulator according to claim 1, wherein when the first, second, and third pairs of DC voltages located on the circumference of the virtual circle are set as said at least three measurement points $B_1$, $B_2$, and $B_3$, in calculating the coordinates of the center of the virtual circle as the carrier leak adjustment point, a first orthogonal bisector $y_1$ which is orthogonal to a line segment $B_1B_2$ and bisects the line segment $B_1B_2$ is calculated first, a second orthogonal bisector $y_2$ which is orthogonal to a line segment $B_2B_3$ and bisects the line segment $B_2B_3$ is then calculated, and coordinates of an intersection of the first and second orthogonal bisectors $y_1$ and $y_2$ are obtained as the coordinates of the center of the virtual circle.

4. A carrier leak adjustment method for a quadrature modulator for receiving a carrier signal and I and Q signals and quadrature-modulating the carrier signal with the I and Q signals, which cancels out a carrier leak contained in a modulated signal output from the quadrature modulator by respectively adding DC adjustment voltages to the I and Q signals, comprising:

respectively adding, to the I and Q signals, a first pair of DC voltages which set a signal level of the modulated signal to a predetermined reference level while signal levels of the I and Q signals are set at "0";

sequentially obtaining second and third pairs of DC voltages which set the signal level of the modulated signal to the predetermined reference level by changing the first pair of DC voltages;

deciding, based on the first, second, and third pairs of DC voltages, at least three measurement points based on a combination of pairs of DC voltages which sets the signal level of the modulated signal to the predetermined reference level;

assuming that the first, second, and third pairs of DC voltages which provide at least three decided measurement points are located on a circumference of a single virtual circle drawn on a two-dimensional coordinate system with a pair of DC voltages to be respectively added to the I and Q signals being plotted as an ordinate and an abscissa, and calculating coordinates of the center of the virtual circle as the carrier leak adjustment point; and respectively adding, to the I and Q signals, a pair of DC voltages as adjustment voltages which specify the coordinates of the calculated carrier leak adjustment point.

5. A carrier leak adjustment method for a quadrature modulator according to claim 4, wherein when the first pair of DC voltages are to be changed, the second pair of DC voltages are obtained by fixing one of the pair of DC voltages to be added to the I and Q signals which is added to one signal and changing the voltage added to another signal, and the third pair of DC voltages are obtained by fixing the voltage added to the other signal and changing the voltage added to said one signal.

6. A carrier leak adjustment method for a quadrature modulator according to claim 4, wherein when the first, second, and third pairs of DC voltages located on the circumference of the virtual circle are set as said at least three measurement points $B_1$, $B_2$, and $B_3$, in calculating the coordinates of the center of the virtual circle as the carrier leak adjustment point, a first orthogonal bisector $y_1$ which is orthogonal to a line segment $B_1B_2$ and bisects the line segment $B_1B_2$ is calculated first, a second orthogonal bisector $y_2$ which is orthogonal to a line segment $B_2B_3$ and bisects the line segment $B_2B_3$ is then calculated, and coordinates of an intersection of the first and second orthogonal bisectors $y_1$ and $y_2$ are obtained as the coordinates of the center of the virtual circle.

7. A quadrature modulation apparatus comprising:

a quadrature modulator body which receives a carrier signal and I and Q signals, quadrature-modulates the carrier signal with the I and Q signals, and outputs the carrier signal as a modulated signal;

a level detecting section which detects a signal level of the modulated signal output from the quadrature modulator body;

a pair of variable voltage sources which generate at least first, second, and third pairs of DC voltages which are a plurality of pairs of DC voltages to be respectively added to the I and Q signals and each of which sets the signal level of the modulated signal to a predetermined reference level;

a voltage addition instructing section which sequentially adds the first, second, and third pairs of DC voltages generated by the pair of variable voltage sources to the I and Q signals, respectively, while the signal levels of the I and Q signals are set at "0";

a reference level determining section which determines that signal levels of the modulated signal detected by the level detecting section become the predetermined reference level in a state in which the first, second, and third pairs of DC voltages generated by the pair of variable voltage sources are respectively added to the I and Q signals based on instructions from the voltage addition instructing section;

a measurement point deciding section which decides at least three measurement points based on a combination of pairs of DC voltages which set the signal level of the modulated signal to the predetermined reference level in a state in which the reference level determining section determines that the signal levels of the modulated signal which correspond to the first, second, and third pairs of DC voltages are set to the predetermined reference level;

an adjustment point calculating section which assumes that the first, second, and third pairs of DC voltages which provide at least three measurement points decided by the measurement point deciding section are located on a circumference of a single virtual circle drawn on a two-dimensional coordinate system with a pair of DC voltages to be respectively added to the I and Q signals being plotted as an ordinate and an abscissa, and calculates coordinates of the center of the virtual circle as the carrier leak adjustment point; and an adjustment voltage addition instructing section which gives an instruction to respectively add, to the I and Q signals through the pair of variable voltage sources, a pair of DC voltages as adjustment voltages which specify the coordinates of the carrier leak adjustment point calculated by the adjustment point calculating section.

8. A quadrature modulation apparatus according to claim 7, wherein when the second and third pairs of DC voltages are to be generated, the pair of variable voltage sources obtain the second pair of DC voltages by fixing one of the first pair of DC voltages to be added to the I and Q signals which is added to one signal and changing the voltage added to another signal, and obtain the third pair of DC voltages by fixing the voltage added to the other signal and changing the voltage added to said one signal.

9. A quadrature modulation apparatus according to claim 7, wherein when the first, second, and third pairs of DC voltages located on the circumference of the virtual circle are set as said at least three measurement points $B_1$, $B_2$, and $B_3$, in calculating the coordinates of the center of the virtual circle as the carrier leak adjustment point, the adjustment point calculating section calculates first a first orthogonal bisector $y_1$ which is orthogonal to a line segment $B_1B_2$ and bisects the line segment $B_1B_2$, then calculates a second orthogonal bisector $y_2$ which is orthogonal to a line segment $B_2B_3$ and bisects the line segment $B_2B_3$, and obtains coordinates of an intersection of the first and second orthogonal bisectors $y_1$ and $y_2$ as the coordinates of the center of the virtual circle.

10. A quadrature modulation apparatus according to claim 7, wherein a modulated signal output from the quadrature modulator body is supplied to the level detecting section through a high-frequency circuit including an amplifier.

11. A quadrature modulation apparatus according to claim 7, wherein a modulated signal output from the quadrature modulator body is supplied to the reference level determining section, after a level of the modulated signal is detected by the level detecting section, through a level reading section which reads the level of the modulated signal and analog/digital-converts or binarizes the level.

12. A quadrature modulation apparatus comprising:
a quadrature modulator body which receives a carrier signal and I and Q signals, quadrature-modulates the carrier signal with the I and Q signals, and outputs the carrier signal as a modulated signal;
level detecting means for detecting a signal level of the modulated signal output from the quadrature modulator body;
a pair of variable voltage sources which generate at least first, second, and third pairs of DC voltages which are a plurality of pairs of DC voltages to be respectively added to the I and Q signals and each of which sets the signal level of the modulated signal to a predetermined reference level;
voltage addition instructing means for sequentially adding the first, second, and third pairs of DC voltages generated by the pair of variable voltage sources to the I and Q signals, respectively, while the signal levels of the I and Q signals are set at "0";
reference level determining means for determining that signal levels of the modulated signal detected by the level detecting section become the predetermined reference level in a state in which the first, second, and third pairs of DC voltages generated by the pair of variable voltage sources are respectively added to the I and Q signals based on instructions from the voltage addition instructing means;
measurement point deciding means for deciding at least three measurement points based on a combination of pairs of DC voltages which set the signal level of the modulated signal to the predetermined reference level in a state in which the reference level determining means determines that the signal levels of the modulated signal which correspond to the first, second, and third pairs of DC voltages are set to the predetermined reference level;
adjustment point calculating means for assuming that the first, second, and third pairs of DC voltages which provide at least three measurement points decided by the measurement point deciding means are located on a circumference of a single virtual circle drawn on a two-dimensional coordinate system with a pair of DC voltages to be respectively added to the I and Q signals being plotted as an ordinate and an abscissa, and calculating coordinates of the center of the virtual circle as the carrier leak adjustment point; and
adjustment voltage addition instructing means for giving an instruction to respectively add, to the I and Q signals through the pair of variable voltage sources, a pair of DC voltages as adjustment voltages which specify the coordinates of the carrier leak adjustment point calculated by the adjustment point calculating means.

13. A quadrature modulation apparatus according to claim 12, wherein when the second and third pairs of DC voltages are to be generated, the pair of variable voltage sources obtain the second pair of DC voltages by fixing one of the first pair of DC voltages to be added to the I and Q signals which is added to one signal and changing the voltage added to another signal, and obtain the third pair of DC voltages by fixing the voltage added to the other signal and changing the voltage added to said one signal.

14. A quadrature modulation apparatus according to claim 12, wherein when the first, second, and third pairs of DC voltages located on the circumference of the virtual circle are set as said at least three measurement points $B_1$, $B_2$, and $B_3$, in calculating the coordinates of the center of the virtual circle as the carrier leak adjustment point, the adjustment point calculating means calculates first a first orthogonal bisector $y_1$ which is orthogonal to a line segment $B_1B_2$ and bisects the line segment $B_1B_2$, then calculates a second orthogonal bisector $y_2$ which is orthogonal to a line segment $B_2B_3$ and bisects the line segment $B_2B_3$, and obtains coordinates of an intersection of the first and second orthogonal bisectors $y_1$ and $y_2$ as the coordinates of the center of the virtual circle.

15. A quadrature modulation apparatus according to claim 12, wherein a modulated signal output from the quadrature modulator body is supplied to the level detecting means through a high-frequency circuit including an amplifier.

16. A quadrature modulation apparatus according to claim 12, wherein a modulated signal output from the quadrature modulator body is supplied to the reference level determining means, after a level of the modulated signal is detected by the level detecting section, through level reading means which reads the level of the modulated signal and analog/digital-converts or binarizes the level.

* * * * *